(12) United States Patent
Kim

(10) Patent No.: US 9,379,027 B2
(45) Date of Patent: Jun. 28, 2016

(54) METHOD OF UTILIZING TRENCH SILICIDE IN A GATE CROSS-COUPLE CONSTRUCT

(71) Applicant: GLOBALFOUNDRIES Inc., Grand Cayman (KY)

(72) Inventor: Ryan Ryoung-han Kim, Albany, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/515,140

(22) Filed: Oct. 15, 2014

(65) Prior Publication Data

US 2016/0111341 A1    Apr. 21, 2016

(51) Int. Cl.
| | | |
|---|---|---|
| *H01L 21/82* | (2006.01) | |
| *H01L 21/8238* | (2006.01) | |
| *H01L 27/092* | (2006.01) | |
| *H01L 23/535* | (2006.01) | |

(52) U.S. Cl.
CPC ....... *H01L 21/823871* (2013.01); *H01L 21/823821* (2013.01); *H01L 23/535* (2013.01); *H01L 27/0924* (2013.01)

(58) Field of Classification Search
CPC .............. H01L 21/823431; H01L 21/845

USPC ............ 438/254, 283, 287, 216, 197
See application file for complete search history.

(56) References Cited

U.S. PATENT DOCUMENTS

2013/0228866 A1*  9/2013  Lee et al. ............ 257/355
2013/0330889 A1*  12/2013  Yin et al. ............ 438/197

* cited by examiner

*Primary Examiner* — Chuong A Luu
*Assistant Examiner* — Rodolfo Fortich
(74) *Attorney, Agent, or Firm* — Ditthavong & Steiner, P.C.

(57) ABSTRACT

A method of forming a logic cell utilizing a TS gate cross-couple construct and the resulting device are provided. Embodiments include forming active fins and dummy fins on a substrate, the dummy fins adjacent to each other and between the active fins; forming STI regions between and next to the active and dummy fins; forming gate structures in parallel across the active and dummy fins; forming a gate cut region by cutting the gate structures between the dummy fins; forming a TS layer between the gate structures, the TS layer crossing the gate cut region; and forming a contact connecting a gate structure and the TS layer on a first side of the gate cut region and forming a contact connecting a gate structure and the TS layer on a second side of the gate cut region, the TS layer and contacts cross coupling the gate structures.

6 Claims, 4 Drawing Sheets

US 9,379,027 B2

METHOD OF UTILIZING TRENCH SILICIDE IN A GATE CROSS-COUPLE CONSTRUCT

TECHNICAL FIELD

The present disclosure relates to semiconductor cross-coupling designs. The present disclosure is particularly applicable to 7 nanometer (nm) technology nodes and beyond.

BACKGROUND

Cross-couple gate structures are important for standard cell design to achieve product area scaling goals for logic and memory peripheral. For example, cross-coupling structures may be used to connect a p-type metal-oxide-semiconductor (pMOS) gate transistor and n-type MOS (nMOS) gate transistor with different gates in a logic cell. However, as technology node advances such as 14 nm technology nodes and beyond, lithography resolution is insufficient to print connected gates.

For example, middle of line (MOL) layers such as source/drain contacts (CA) and gate contacts (CB) can be used to cross couple gates. Such an approach for forming a cross-coupled logic cell is illustrated in FIGS. 1A and 1B (FIG. 1A is a top view and FIG. 1B is a generalized cross-sectional view). Adverting to FIG. 1A, active fins (or active layer) 101a and 101b and dummy fins 103a and 103b (to be eliminated) are formed with STI regions 105 therebetween. Gate structures 107, e.g., 107a-107e, are then formed across the active fins 101a and 101b, the dummy fins 103a and 103b, and the STI regions 105. Next, gate contacts 109 and S/D contacts 111 are formed on the gate structures 107a through 107e and active fins 101a and 101b, respectively. Thereafter, portions of gate structures 107b and 107c are cut out between the active or dummy fins 103a and 103b, e.g., by double patterning, to form the gate cut region 113. Consequently, the neighboring pMOS formed by active fins 101a and the nMOS formed by active fins 101b along the same gate are disconnected.

Adverting to FIG. 1B, gate structures 107 are formed on a substrate 121, the substrate 121 having silicide or salicide portions 123. Next, gate contacts 109 and S/D contacts 111 are formed on the gate structures 107 and the silicide portions 123, respectively. A metal layer 125 is then formed on top of the gate contacts 109 and S/D contacts 111, respectively. As shown, gate contacts 109 and S/D contacts 111 are formed on the same level. Consequently, as shown by the arrows in FIG. 1A, tight spacing among the S/D contacts 111 and 115 and gate contacts 109 causes considerable congestion, which in turn reduces overall design flexibility.

A need therefore exists for methodology enabling cross coupling of disconnected gates in advanced logic cells while mitigating design congestion.

SUMMARY

An aspect of the present disclosure is a process of forming a logic cell utilizing a trench silicide (TS) layer in a gate cross-couple construct.

Another aspect of the present disclosure is a logic cell device having a TS layer gate cross-couple construct.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second active fins and first and second dummy fins on a substrate, the first and second dummy fins adjacent to each other and between the first and second active fins; forming STI regions between and next to the first and second active fins and the first and second dummy fins; forming first and second gate structures in parallel across the first and second active fins and the first and second dummy fins; forming a gate cut region by cutting the first and second gate structures between the first and second dummy fins; forming a TS layer between the first and second gate structures, the TS layer crossing the gate cut region; and forming a first contact connecting the first gate structure and the TS layer on a first side of the gate cut region and forming a second contact connecting the second gate structure and the TS layer on a second side of the gate cut region, the TS layer and first and second contacts cross coupling the first and second gate structures.

Aspects of the present disclosure include forming the TS layer over at least one STI region. Other aspects include forming the TS layer to approximately the same height as the height of the first and second gate structures. Further aspects include forming the TS layer of tungsten (W). Additional aspects include comprising forming connected pMOS and nMOS gate transistors with the first and second active fins, respectively, and the cross-coupled first and second gate structures. Another aspect includes comprising forming the first and second contacts by: forming first and second capping layers on the first and second gate structures; forming first and second recesses on opposite sides of the gate cut region in the TS layer and the first and second capping layers, respectively, down to the first and second parallel gate structures; and forming the first and second contacts in the first and second recesses. Other aspects include comprising forming the first and second contacts as rectangles perpendicular to the first and second gate structures, at an angle to the first and second gate structures, or in an "L" shape.

Another aspect of the present disclosure is a device including: first and second active fins formed on a substrate; a space formed between the first and second active fins first and second gate structures formed in parallel across the first and second active fins; a gate cut region formed in the space perpendicular to the first and second gate structures; a TS layer formed of W, in the space, and between the first and second gate structures, the TS layer crossing the gate cut region; and a first contact formed across the first gate structure and the TS layer on a first side of the gate cut region and a second contact formed across the second gate structure and the TS layer on a second side of the gate cut region, the TS layer and the first and second contacts cross coupling the first and second gate structures.

Aspects of the device include the TS layer being formed over at least one STI region formed between and next to the first and second active fins. Other aspects include the TS layer being formed to approximately the same height as the first and second gate structures. Further aspects include connected pMOS and nMOS gate transistors being formed by the first and second active fins and the cross-coupled first and second gate structures. Additional aspects include the first and second contacts being formed as rectangles perpendicular to the first and second gate structures, at angles to the first and second gate structures, or in an "L" shape. Another aspect includes the first and second gate structures being formed with a first and second capping layer, respectively. Other aspects include the first and second contacts being formed in the first and second capping layers, down to the first and second gate structures, respectively.

A further aspect of the present disclosure is a method including: forming first and second active fins and first and second dummy fins on a substrate, the first and second dummy fins adjacent to each other and between the first and second active fins; forming STI regions between and next to the first and second active fins and the first and second dummy fins; forming first and second gate structures in parallel across the first and second active fins and the first and second dummy fins; forming first and second capping layers on the first and second self-aligned gate structures, respectively; forming a gate cut region by cutting both the first and second self-aligned gate structures and the first and second capping layers between the first and second dummy fins; forming a TS layer of W between the first and second gate structures, the TS layer crossing the gate cut region; and forming a first self-aligned contact connecting the first gate structure and the TS layer on a first side of the gate cut region and forming a second self-aligned contact connected the second gate structure and the TS layer on a second side of the gate cut region, the TS and the first and second self-aligned contacts cross coupling the first and second gate structures.

Aspects of the present disclosure include forming the TS layer over at least one STI region. Other aspects include forming the TS layer to approximately the same height as the height of the first and second self-aligned gate structures. Further aspects include forming connected pMOS and nMOS gate transistors with the first and second plurality of active fins, respectively, and the cross-coupled first and second self-aligned gate structures. Additional aspects include the first and second self-aligned contacts in the first and second capping layers, down to the first and second gate structures, respectively. Another aspect includes forming the first and second self-aligned contacts as rectangles perpendicular to the first and second gate structures, at angles to the first and second gate structures, or in an "L" shape.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of design congestion and integration complexity attendant upon using an S/D contact in a logic cell for a gate cross-couple construct.

Methodology in accordance with embodiments of the present disclosure includes first and second active fins and first and second dummy fins being formed on a substrate, the first and second dummy fins adjacent to each other and between the first and second active fins. STI regions are formed between and next to the first and second active fins and the first and second dummy fins. First and second gate structures are formed in parallel across the first and second active fins and the first and second dummy fins. A gate cut region is formed by cutting the first and second gate structures between the first and second dummy fin. A TS layer is formed between the first and second gate structures, the TS layer crossing the gate cut region. A first contact connecting the first gate structure and the TS layer is formed on a first side of the gate cut region and a second contact connecting the second gate structure and the TS layer is formed on a second side of the gate cut region, the first and second gate structures being cross-coupled by the TS layer and first and second contacts.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
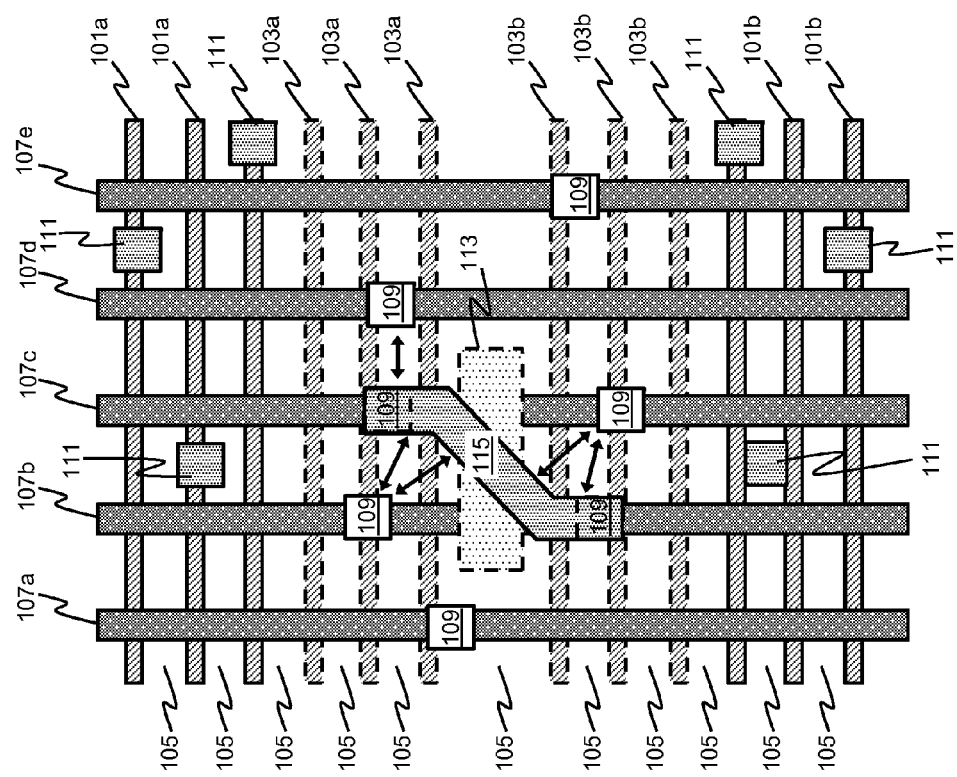
FIGS. 1A and 1B schematically illustrate top and cross-sectional views, respectively, of a background logic cell device including a gate cross-couple structure.
Figure 1B:
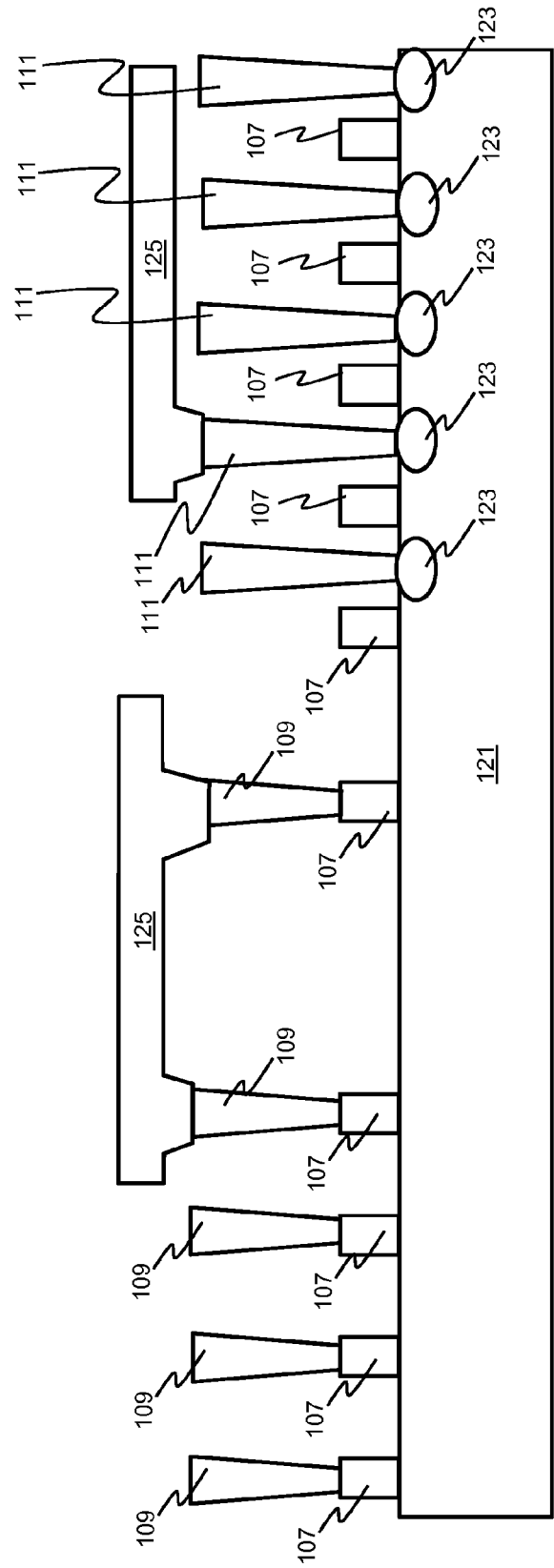
Figure 2A:
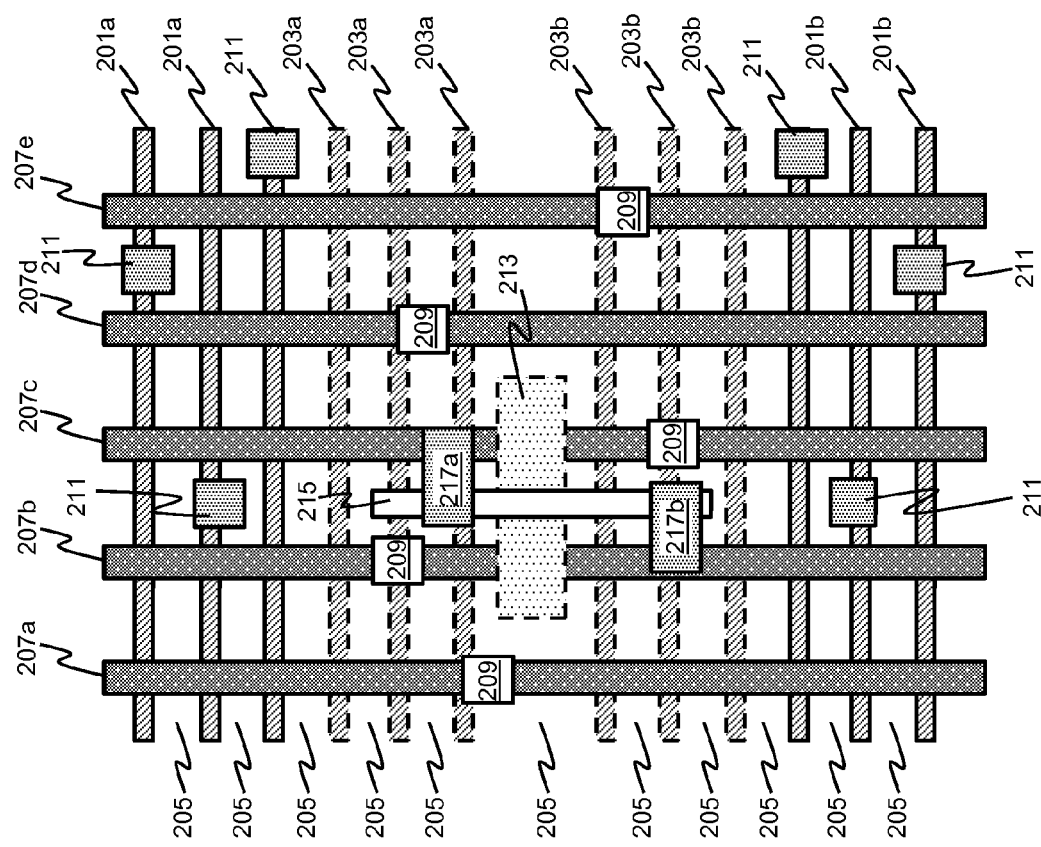
FIGS. 2A and 2B schematically illustrate top and cross-sectional views, respectively, of a logic cell device with a TS gate cross-couple structure, in accordance with an exemplary embodiment of the present disclosure.
Figure 2B:
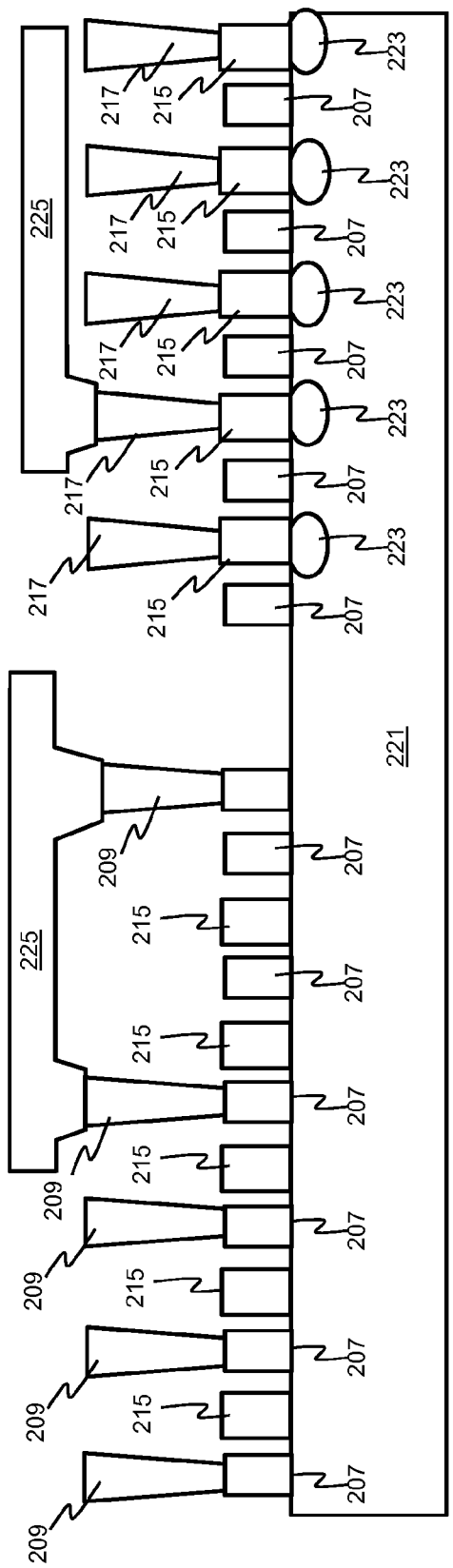

Adverting to FIGS. 2A and 2B (FIG. 2A is a top view and FIG. 2B is a generalized cross-sectional view), active fins 201a and 201b and dummy fins 203a and 203b may be formed, for example, on or of a silicon substrate (not shown for illustrative convenience). Next, STI regions 205 may be formed, e.g., between and next to the active fins 201a and 201b and dummy fins 203a and 203b. Gate structures 207, e.g., 207a through 207e, may then be formed, for example, across the active fins 201a and 201b, the dummy fins 203a and 203b, and the STI regions 205. Gate contacts 209 and S/D contacts 211 may then be formed, for example, on the gate structures 207a-207e and fins 201a and 201b, respectively.

Next, gates 207b and 207c are cut, e.g., by double patterning, forming the gate cut region 213. A TS layer 215 may then be formed, for example, between the gates 207b and 207c and across the gate cut region 213. The TS layer 215 may be formed, for example, of W. In addition, the TS layer 215 may be formed, for example, over at least one STI region 205. Further, the TS layer 215 may also be formed, for example, to approximately the same height as gates 207a through 207e, as depicted in FIG. 2B.

A contact 217, e.g., contact 217a, may be formed, for example, on the upper side of the gate cut region 213 connecting gate structure 207c and the TS layer 215. At or about the same time, a contact 217, e.g., contact 217b, may be formed, for example, on the lower side of the gate cut region 213 and thereby connecting gate structure 207b and the TS layer 215. The contacts 217a and 217b may be formed, for example, as a rectangular gate contact construct. In particular, if self-aligned contacts are used, the contacts 217a and 217b may be formed, for example, by first forming a capping layer (not shown for illustrative convenience) on each of the gate structures 207a through 207e. A recess may then be formed, for example, on opposite sides of the gate cut region 213 in the TS layer 215 and the capping layers of gate structures 207b and 207c. Thereafter, the contacts 217a and 217b may be formed, for example, in the respective recesses. In addition, the contacts 217a and 217b each may be formed, for example, as a rectangle perpendicular to the gate structures 207b and 207c, at an angle to gate structures 207b and 207c, or in an "L" shape. Consequently, the TS layer 215 and the contacts 217a and 217b cross couple the top portion of gate structure 207c and the lower portion of gate structure 207b and, therefore, also connect the pMOS gate transistor formed over active fins 201a and the nMOS gate transistor formed over active fins 201b. Because the TS layer is defined as a lower level, routing congestion may be relieved for upper layers above the TS layer. In other words, by using TS layer 215 to enable cross couple, design flexibility can be achieved by pushing the cross coupling to a lower level than any MOL layers and, therefore, space congestion can be reduced.

Adverting to FIG. 2B, gate structures 207 are formed on a substrate 221 having silicide portions 223. Next, a TS layer 215 may be formed, for example, between the gate structures 207. The TS layer 215 may be formed, for example, to approximately the same height as the gate structures 207. Gate contacts 209 are then formed on the gate structures 207 and contacts 217, e.g., rectangular gate contact constructs, are formed on the TS layer 215. A metal layer 225 is then formed on top of the gate contacts 209 and contacts 217, respectively.

The embodiments of the present disclosure can achieve several technical effects including cross-coupling gates structures while mitigating design congestion. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including logic cells, particularly in 7 nm technologies nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second active fins and first and second dummy fins on a substrate, the first and second dummy fins adjacent to each other and between the first and second active fins;
   forming shallow trench isolation (STI) regions between and next to the first and second active fins and the first and second dummy fins;
   forming first and second gate structures in parallel across the first and second active fins and the first and second dummy fins;
   forming a gate cut region by cutting the first and second gate structures between the first and second dummy fins;
   forming a trench silicide (TS) layer between the first and second gate structures, the TS layer crossing the gate cut region; and
   forming a first contact connecting the first gate structure and the TS layer on a first side of the gate cut region and forming a second contact connecting the second gate structure and the TS layer on a second side of the gate cut region, the TS layer and first and second contacts cross coupling the first and second gate structures, the first and second contacts formed by:
      forming first and second capping layers on the first and second gate structures;
      forming first and second recesses on opposite sides of the gate cut region in the TS layer and the first and second capping layers, respectively, down to the first and second parallel gate structures; and
      forming the first and second contacts in the first and second recesses.

2. The method according to claim 1, comprising forming the TS layer over at least one STI region.

3. The method according to claim 1, comprising forming the TS layer to approximately the same height as the height of the first and second gate structures.

4. The method according to claim 1, comprising forming the TS layer of tungsten (W).

5. The method according to claim 1, further comprising forming connected p-type metal-oxide-semiconductor (pMOS) and n-type MOS (nMOS) gate transistors with the first and second active fins, respectively, and the cross-coupled first and second gate structures.

6. The method according to claim 1, comprising forming the first and second contacts as rectangles perpendicular to the first and second gate structures, at an angle to the first and second gate structures, or in a "L" shape.

* * * * *